United States Patent
Chih et al.

(10) Patent No.: US 7,135,914 B2
(45) Date of Patent: Nov. 14, 2006

(54) HIGH VOLTAGE CMOS SWITCH WITH REDUCED HIGH VOLTAGE JUNCTION STRESSES

(75) Inventors: Yue-Der Chih, Hsin-Chu (TW); Shine Chung, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/808,122

(22) Filed: Mar. 24, 2004

(65) Prior Publication Data

US 2005/0212567 A1    Sep. 29, 2005

(51) Int. Cl.
*G05F 3/02* (2006.01)
(52) U.S. Cl. .................... 327/543; 327/328
(58) Field of Classification Search ........ 327/309–310, 327/317–319, 321, 327–328, 333, 530, 534–535, 327/537, 540–546; 326/80–81

See application file for complete search history.

(56) References Cited

U.S. PATENT DOCUMENTS

| | | | |
|---|---|---|---|
| 5,559,464 A * | 9/1996 | Orii et al. ................... 327/333 |
| 6,169,432 B1 | 1/2001 | Sharpe-Geisler ............ 327/112 |
| 6,268,744 B1 * | 7/2001 | Drapkin et al. ............... 326/81 |
| 6,370,071 B1 | 4/2002 | Lall et al. ................... 365/205 |
| 6,801,064 B1 * | 10/2004 | Hunt et al. ................... 327/112 |
| 6,833,746 B1 * | 12/2004 | Drapkin et al. ............. 327/333 |
| 6,859,074 B1 * | 2/2005 | Ajit ............................ 327/108 |

* cited by examiner

*Primary Examiner*—My-Trang Nu Ton
(74) *Attorney, Agent, or Firm*—Preston Gates & Ellis LLP

(57) ABSTRACT

A high voltage switch circuit is disclosed for reducing high voltage junction stresses. The circuit contains a cascode device structure having one or more transistors of a same type connected in a series and being operable with a normal operating voltage and a high operating voltage. The cascode device structure comprises a high operating voltage coupled to a first end of the device structure, a low voltage coupled to a second end, and one or more control voltages controllably coupled to the gates of the transistors, wherein at least one of the control voltages coupled to the gate of at least one transistor is raised to a medium voltage level that is higher than a normal operating voltage when operating under the high operating voltage for tolerating stress imposed thereon by the high operating voltage.

6 Claims, 9 Drawing Sheets

| Stress Voltage | Switch circuit 100 | Switch circuit 300 |
|---|---|---|
| drain to source (punch through) | < (VH - VDD + Vtn)  for nMOS<br>> - (VH - VDD + \|Vtp\|) for pMOS | < (VH - VM + Vtn)  for nMOS<br>> - (VH - VM + \|Vtp\|) for pMOS |
| drain to gate (gated breakdown) | VH - VDD  for nMOS<br>- (VH - VDD)  for pMOS | VH - VM  for nMOS<br>- (VH - VM)  for pMOS |

| Stress Voltage | Switch circuit 100 | Switch circuit 300 |
|---|---|---|
| drain to source (punch through) | < 11.7V  for nMOS<br>> -11.7V  for pMOS | < 7.0V  for nMOS<br>> -7.0V  for pMOS |
| drain to gate (gated breakdown) | 11.2V  for nMOS<br>-11.2V  for pMOS | 6.5V  for nMOS<br>-6.5V  for pMOS |

HIGH VOLTAGE CMOS SWITCH WITH REDUCED HIGH VOLTAGE JUNCTION STRESSES

BACKGROUND

The present disclosure relates generally to semiconductor devices; and more particularly, to the protection of semiconductor devices from high voltage junction stresses. Still more particularly, the present disclosure relates to a modified switch design and method to reduce its high voltage junction stresses, thereby decreasing the required integrated circuit (IC) high voltage requirement.

Complementary metal oxide semiconductor (CMOS) technology is a preferred fabrication process for many integrated circuit devices, particularly those wherein low power consumption and high component density are important considerations. These devices may be found in laptops and other portable electronic devices. For example, these portable electronic devices utilize memory devices such as erasable programmable read only memories (EPROMs), and electrically erasable programmable read only memories (EEPROMs). Typically, a low voltage signal is used to switch on a high voltage output, which is then used to operate the memories. In other words, a low voltage input signal (typically 0.5 to 2 volts) is used to switch high voltage outputs (typically 13 to 15 volts) for circuits such as row and column address decoders, signal level translators, programming circuits, and output pad drivers.

The structure of CMOS technologies is dependent upon the required performance of the CMOS device. Since the structure of semiconductors designed to operate at high voltages; e.g., to withstand a high voltage junction stress, is different from the structure of semiconductors designed to operate at regular voltages, additional IC fabrication steps and fabrication masks are required to produce circuitries whose operating voltages include regular and high voltages. The requirement of extra fabrication steps and fabrication masks result in a longer processing cycle and higher processing costs.

Desirable in the art of semiconductor devices are additional designs that reduce high voltage junction stresses, thereby decreasing the required IC high voltage requirement and hence the required fabrication steps.

SUMMARY

In view of the foregoing, this disclosure provides examples of a modified high voltage CMOS switch circuit, and a method to reduce the high voltage junction stresses inherent in a high voltage CMOS switch, thereby reducing the process steps required for the high voltage junction protection. The fabrication process steps and associated masks can be reduced, thereby reducing the fabrication processing time and production costs.

In one example, the circuit contains a cascode device structure having one or more transistors of a same type connected in a series, and being operable with a normal operating voltage, and a high operating voltage. The cascode device structure comprises a high operating voltage coupled to a first end of the device structure; a low voltage coupled to a second end; and one or more control voltages controllably coupled to the gates of the transistors, wherein at least one of the control voltages coupled to the gate of at least one transistor is raised to a medium voltage level that is higher than a normal operating voltage when operating under the high operating voltage for tolerating stress imposed thereon by the high operating voltage.

Various aspects and advantages will become apparent from the following detailed description, taken in conjunction with the accompanying drawings, illustrating the principles of the disclosure by way of examples.

BRIEF DESCRIPTION OF THE DRAWINGS

FIGS. 5A and 5B tabulate stress voltages for the conventional circuit and the switch circuit in accordance with the second example of the present disclosure.

DESCRIPTION

In the present disclosure, examples of modified designs and methods are presented to reduce the high voltage junction stresses inherent in a high voltage CMOS switch, thereby reducing the process steps and costs required for the high voltage junction protection.

Figure 1:
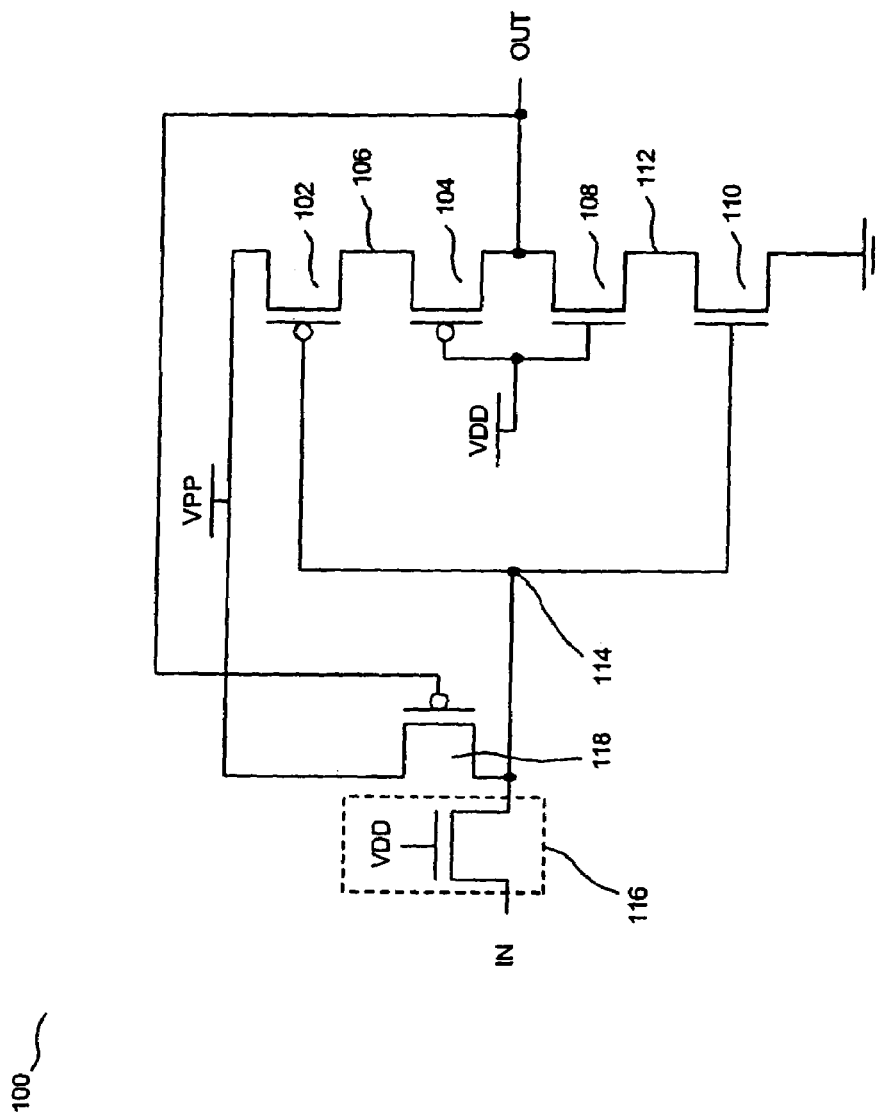
FIG. 1 illustrates a conventional high voltage CMOS switch circuit.

FIG. 1 illustrates a high voltage CMOS switch circuit 100 that switches a high voltage to its output based upon a low voltage input signal. The upper half of the output circuit includes pMOS transistors 102 and 104. The transistor 102 is the P-channel switching device, while the transistor 104 is utilized as the P-channel guard device to prevent gate-aided breakdown. The drain of transistor 102 is connected, via a node 106, to the source of transistor 104. The source of transistor 102 is tied to VPP, while the drain of transistor 104 is tied to an output OUT. VPP is normally at VDD, but can reach a much high voltage. For example, VPP may be required to reach up to 13 volts if the output OUT is used to program memories. The lower half of the output circuit includes nMOS transistors 108 and 110. The drain of transistor 110 is connected, via a node 112, to the source of transistor 108, whose drain is tied to OUT. The source of transistor 110 is tied to VSS, which is typically grounded. Transistor 108 is utilized as the N-channel guard device to prevent a gate-aided breakdown, while transistor 110 is the N-channel switching device.

The gates of transistors 104 and 108 are connected to VDD, or the regular operating voltage. The gates of transistors 102 and 110 are connected to a node 114, which is further connected to a transfer module 116, which is used to pass an input IN to the node 114, and then to the rest of the circuit. In this example, the transfer module 116 includes an nMOS transistor. Node 114 is also connected to the drain of a pMOS transistor 118, whose source is connected to VPP, and whose gate is connected to the output signal OUT.

When the input signal IN is low, and the transfer module 116 is on, node 114 is low, thereby turning transistor 102 on and transistor 110 off. When VPP is switched to a high voltage, e.g., 13 volts, which is much larger than VDD, current will pass through transistor 104, thereby pulling OUT to VPP. Transistor 104 therefore essentially functions as a resistor to provide some bias, such that transistor 102 would be protected from breaking down as VPP rises to a high voltage. When OUT is pulled high, transistor 118 turns off, thereby ensuring that the node 114 is low, and that OUT is latched to VPP correctly. Since VDD, which is very low, is applied to the gates of the transistor 108, the drain stress, e.g., the voltage difference between the drain and source, is VPP−(VDD−Vtn), wherein Vtn is the threshold voltage of the nMOS transistor 108. The gated stress, e.g., the voltage difference between the drain and gate for transistor 108 is about VPP−VDD. Both the gated stress and drain stress are still high.

When IN is high, and the transfer module 116 is on, node 114 is high, thereby turning transistor 102 off, and transistor 110 on. Since both transistors 108 and 110 are on, OUT is immediately pulled to VSS, or low. The gated stress and drain stress on the transistor 104 are similarly high.

Figure 2A:
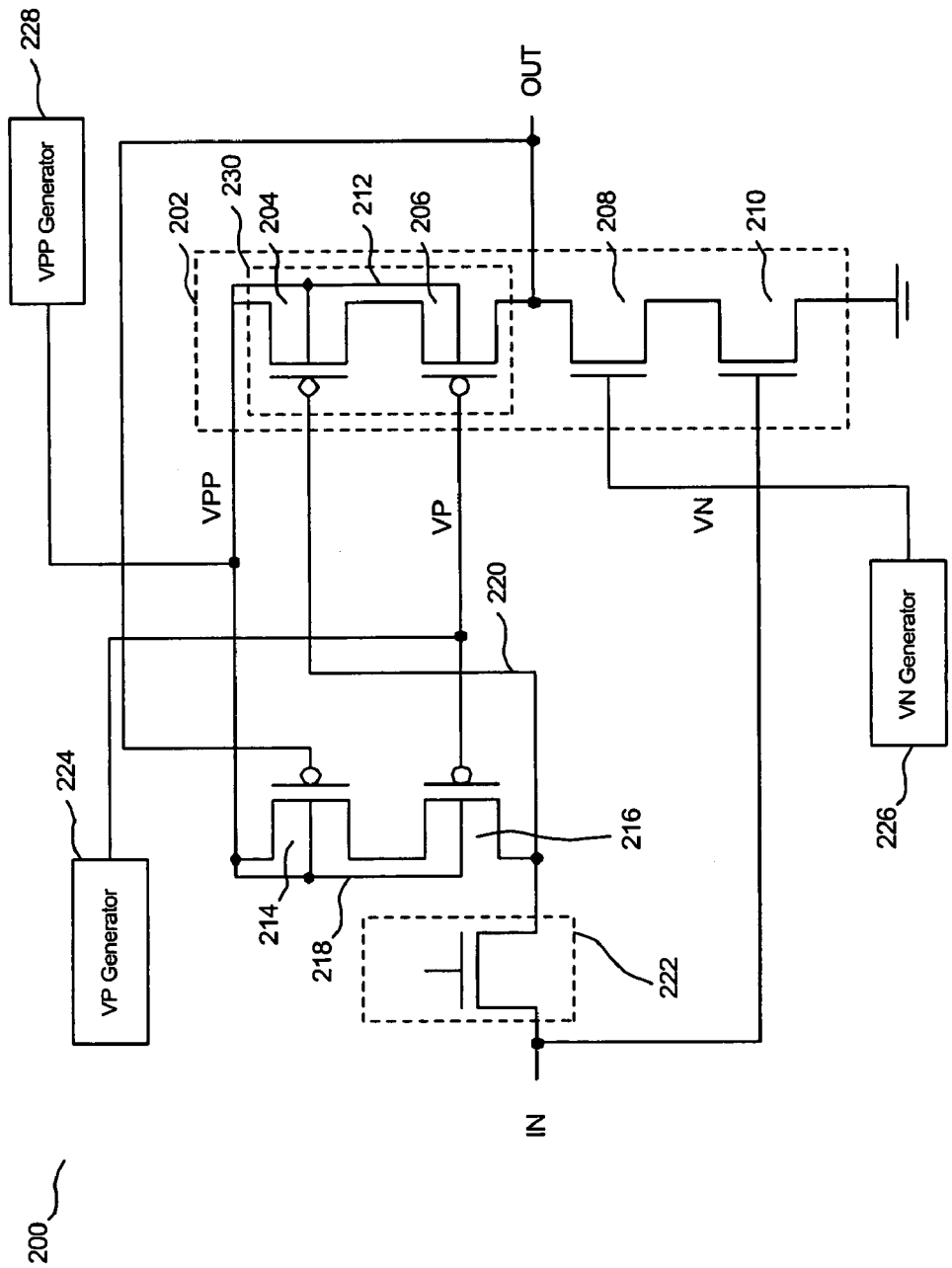
FIG. 2A illustrates a high voltage CMOS switch circuit in accordance with a first example of the present disclosure.

FIG. 2A illustrates a high voltage CMOS switch circuit 200 that provides a higher bias voltage to the guard devices according to one example of the present disclosure. The circuit 200 includes an output circuit 202, which, in turn, includes pMOS transistors 204 and 206, and nMOS transistors 208 and 210. Transistors 204 and 206 are, respectively, the P-channel switching device and the P-channel guard device, while transistors 210 and 208 are, respectively, the N-channel switching device and the N-channel guard device. The N-wells of transistors 204 and 206 are connected to VPP via a node 212. The source of transistor 204 is connected to VPP, while the drain of transistor 206 is connected to an output OUT. The drain of transistor 208 is connected to OUT, while the source of transistor 210 is connected to VSS.

The pMOS transistors 214 and 216 form a cascode arrangement with the pMOS transistors 204 and 206. For the purpose of this disclosure, any two transistors, whether they are N or P type, connected in series, may also be referred to as a cascode device structure (or simply, cascode structure). In essence, transistors 214 and 216 act as a latch for the pMOS output transistors 204 and 206 to ensure that OUT is correct. The N-wells of transistors 214 and 216 are connected to VPP via node 218. The source of transistor 214 is connected to VPP, while the drain of transistor 216 is connected to a node 220. The gate of transistor 214 is connected to OUT, while the gate of transistors 216 and 206 are connected to VP. The gate of transistor 204 is connected to the node 220, which is further connected to one end of a transfer module 222, whose other end is connected to an input IN. The transfer module 222 is used to pass the signal IN to the node 220 and, subsequently, to the rest of the circuit. In this example, the transfer module 222 is an nMOS transistor, while other variations can be applied here as well. The gate of transistor 208 is connected to VN, while the gate of transistor 210 is connected to IN. VP and VN are generated by a pMOS bias voltage generator 224 and an nMOS bias voltage generator 226, respectively, while VPP is generated by a high voltage generator 228. Bias voltage generator 224 switches VP from VDD (typically 1.8 volts) to a bias voltage VM (6.5 volts, assuming that VPP is roughly 13 volts). Bias voltage generator 226 also switches VN from VDD to the bias voltage VM. In one example, VP, VN, and VM are preferred to be a medium voltage around one half of the high voltage operating voltage VH. It is understood that the pMOS bias voltage generator 224 and the nMOS bias voltage generator 226 may be controlled separately depending on the input signal. However, they can also be provided by one generator for some applications.

It is noted that transistors 204 and 206, which together form a P-channel structure 230, have their N-wells coupled to VPP via the node 212. When IN is high, and the transfer module 222 is on, transistor 204 is off, and the drain of transistor 206 is pulled towards VSS. This, in turn, causes a reverse bias between the P+ drain of transistor 206 and its N-well, which is connected, via the node 212, to VPP. Similarly, transistors 214 and 216 have their N-wells coupled to VPP via the node 218. When IN is low, and the transfer module 222 is on, transistor 214 is off, and the drain of transistor 216, is pulled to low. This, in turn, causes a reverse bias between the P+ drain of transistor 216 and its N-well, which is back-connected, via the node 218, to VPP. For sub-micron devices, this reverse bias (VPP−VSS) may be too high for devices not designed to withstand such a bias.

In order to reduce the maximum reverse bias and, hence, the junction stresses, a control circuit may track VPP, and change VP and VN simultaneously, when the VPP voltage level is changed.

Figure 2B:
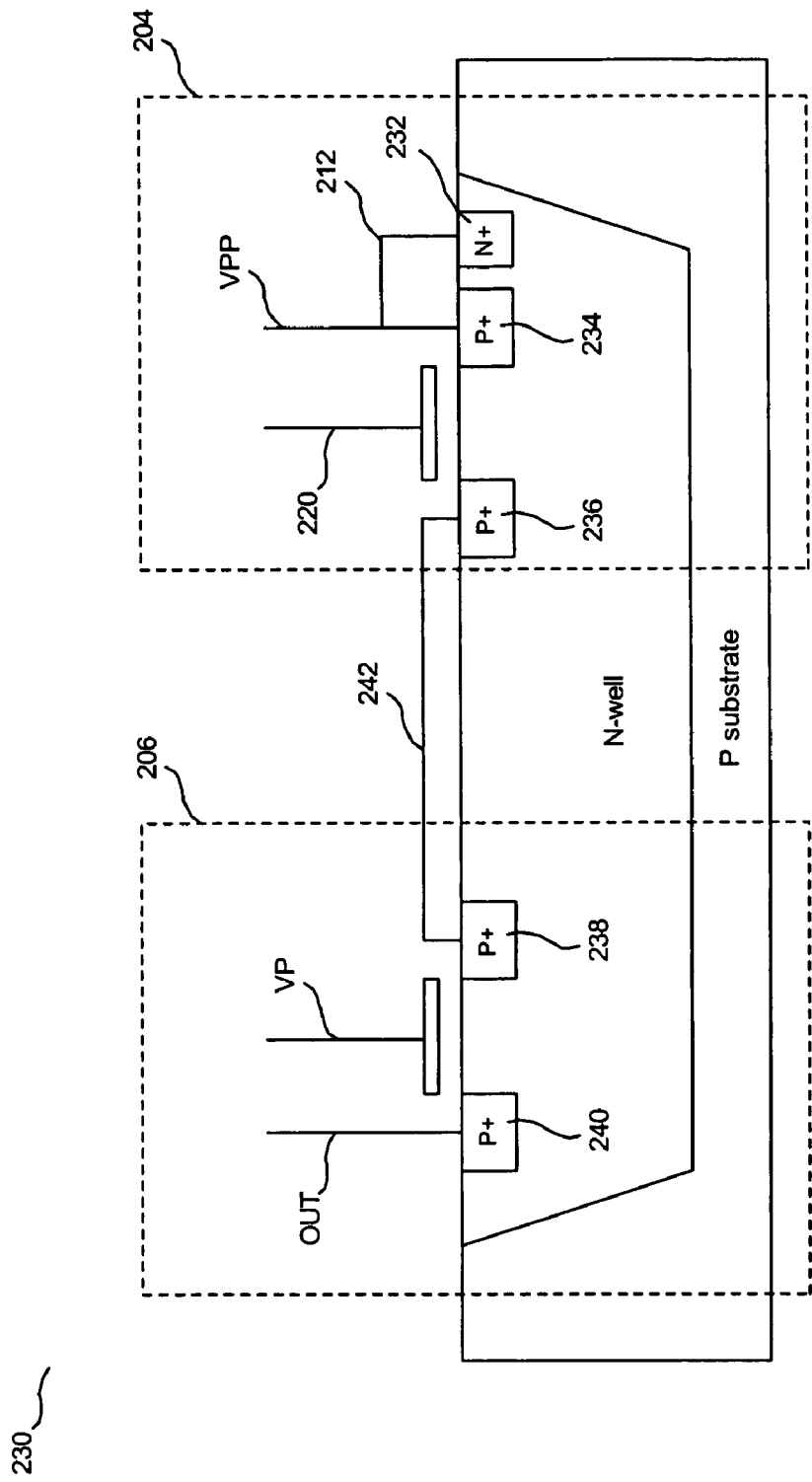
FIG. 2B illustrates a cross-sectional view of the P-channel structure in accordance with the first example of the present disclosure.

FIG. 2B illustrates a cross-sectional view of the P-channel structure 230. The structure 230 is identical to the cross-sectional arrangement of the transistors 214 and 216. The merged N-well is connected to VPP through an N+ material 232, and then through the node 212 onto VPP. The P+ materials 234 and 236 are, respectively, the source and drain of transistor 204. The P+ materials 238 and 240 are, respectively, the source and drain of transistor 206. The P+ materials 236 and 238 are connected via a metal 242. The gates of transistors 204 and 206 are tied to the node 220, and VP, respectively. The drain of transistor 206 is tied to OUT.

In one scenario, and with references to FIGS. 2A and 2B, IN is high and transistor 204 is off. OUT is pulled to VSS when transistor 208 is on. A potential reverse bias of 13 volts, therefore, exists across the N-well.

In 0.18-micron technology, as an example, the typical breakdown voltage Vbd between the low voltage N-well LVNW and the P-substrate is typically 15 volts. Also, Vbd between the P+ material and the low voltage N-well LVNW is typically 9.6 volts. In FIG. 2B, the reverse voltage between the P+ material and the N-well is 13 volts, thereby exceeding the typical Vbd of 9.6 volts. In this example, high voltage LDD implant region for reducing gated stress and drain stress may still be required.

Figure 2C:
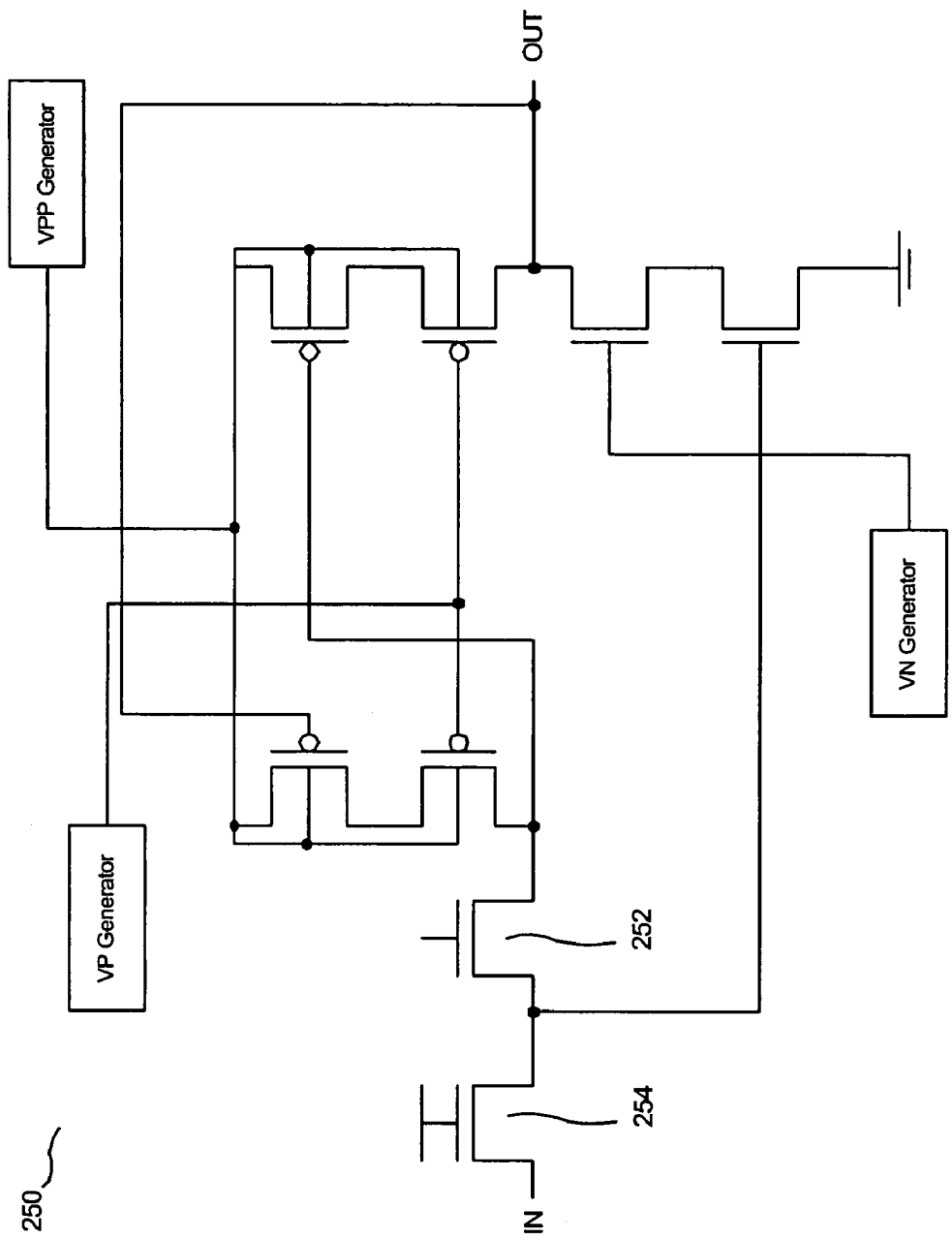
FIG. 2C illustrates a high voltage CMOS switch circuit with a cascode structure for its input module in accordance with one example of the present disclosure.

Another further improvement is to have a cascode structure for passing the input signal IN. FIG. 2C illustrates such a design 250. This design differs from FIGS. 2A and 2B in that an additional nMOS pass gate 252 is connected in series with a first nMOS pass gate 254 to form an input module having their own cascode structure. The gate voltage of the transistor 252 may be raised to a medium value as well as to reduce the high voltage stress imposed on them.

Figure 3A:
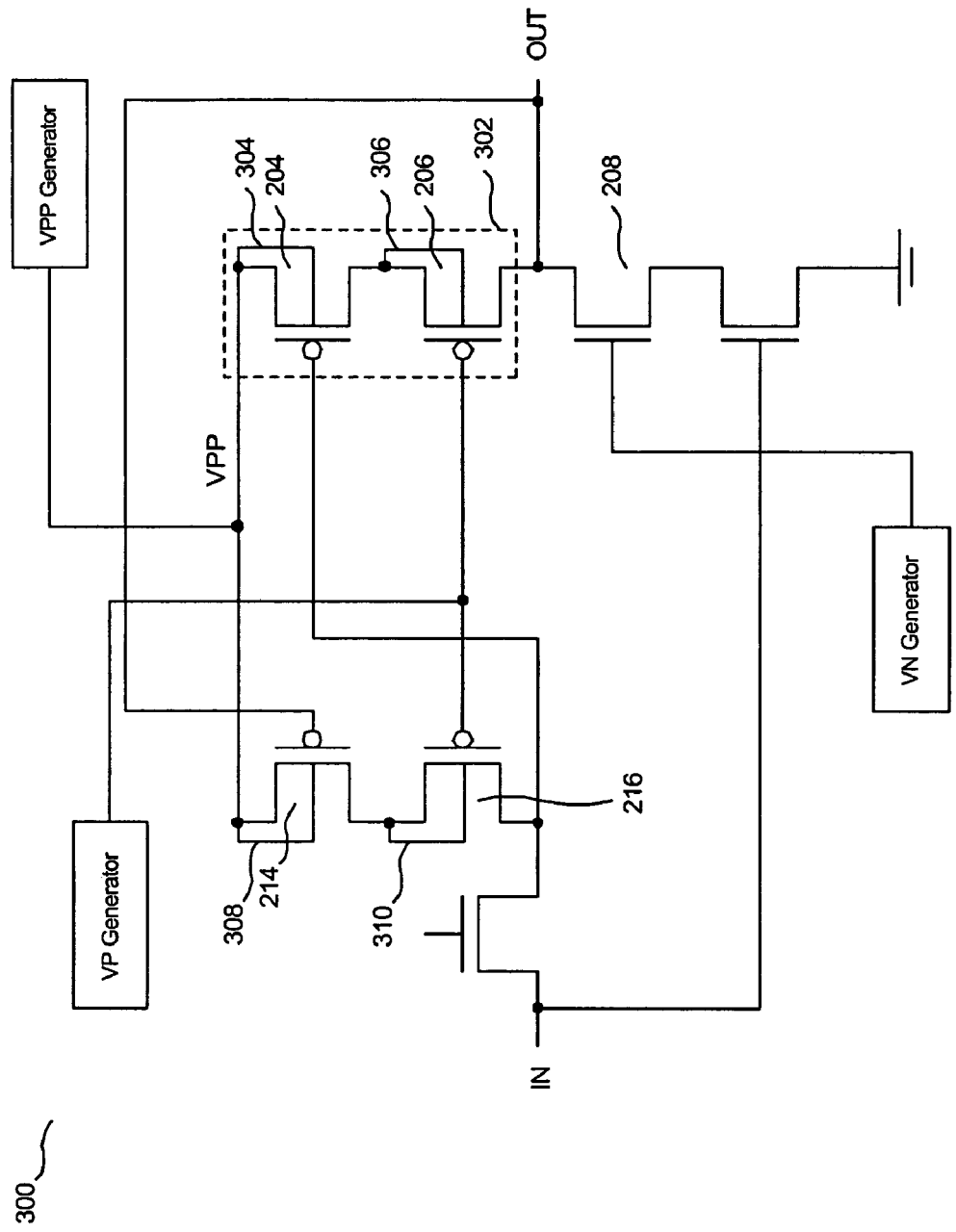
FIG. 3A illustrates a high voltage CMOS switch circuit in accordance with a second example of the present disclosure.

For a merged well, such as the one illustrated in FIG. 2B, in order to avoid additional process steps, separate N-wells may be implemented. FIG. 3A illustrates a high voltage CMOS switch circuit 300 that reduces the possibility of reverse bias junction breakdown as previously described. With references to FIGS. 2A and 3A, the circuit 300 is similar to circuit 200 with the following exceptions: the single, merged N-well for transistors 204 and 206 in circuit 200 are divided into two separate N-wells, thereby eliminating the node 212; and the single, merged N-well for transistors 214 and 216 in circuit 200 are divided into two separate N-wells, thereby eliminating the node 218. With reference to FIG. 3, transistors 204 and 206 with separate N-wells are collectively known as the P-channel structure 302. In other words, P-channel structure 302 is a cascode structure formed by transistors 204 and 206.

The N-well of transistor 204 is connected, via a node 304, to VPP, while the N-well of transistor 206 is connected, via a node 306, to the drain of transistor 204. The cascode transistors 214 and 216 are also modified with separate N-wells. The N-well of transistor 214 is connected, via a node 308, to VPP, while the N-well of transistor 216 is connected, via a node 310, to the drain of transistor 214.

Figure 3B:
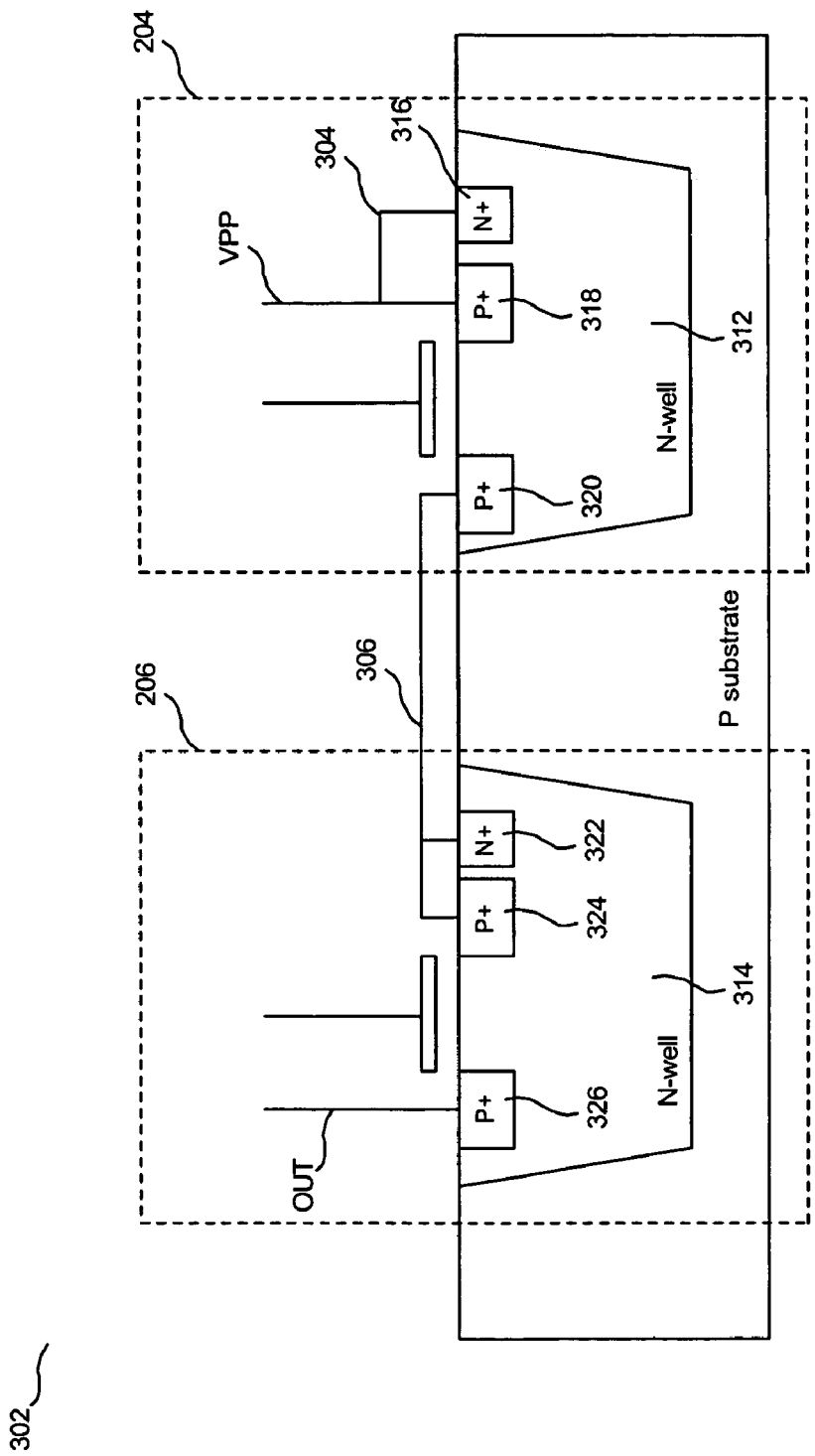
FIG. 3B illustrates a cross-sectional view of the P-channel structure in accordance with the second example of the present disclosure.

FIG. 3B illustrates a cross-sectional view of the P-channel structure 302. Referring to FIGS. 3A and 3B, the cross-sectional arrangement of structure 302 is identical to the cross-sectional arrangement of the transistors 214 and 216. The N-wells corresponding to transistors 204 and 206 are, respectively, N-wells 312 and 314. An N+ material 316 connects the N-well 312, through the node 304, to VPP. The P+ materials 318 and 320 are the source and drain of the transistor 204. The P+ material 320 is further connected, via node 306, to an N+ material 322 and a P+ material 324, which is the source of the transistor 206. The P+ material 326 is the drain of the transistor 206, which is connected to OUT.

In one scenario, and with reference to FIGS. 3A and 3B, IN is high and transistor 204 is off. OUT is pulled to VSS when transistor 208 is on. With separated N-wells, the reverse bias is significantly reduced. For example, if a bias voltage of 6.5 volts is applied to the gate of transistor 206, and if the threshold voltage of the transistor 206 is roughly 0.5 volts, the well reverse junction voltage is roughly 7.0 volts (6.5+0.5 volts). By having two N-wells, a mask for high voltage N-well fabrication may be eliminated, thereby eliminating associated process steps, and reducing processing cost.

It is further understood that although the above examples illustrate that both P type and N type cascode structures are incorporated in a high voltage circuit, they do not have to be there together. For example, in some high voltage circuits, only the N type cascode structure is included.

Figure 4:
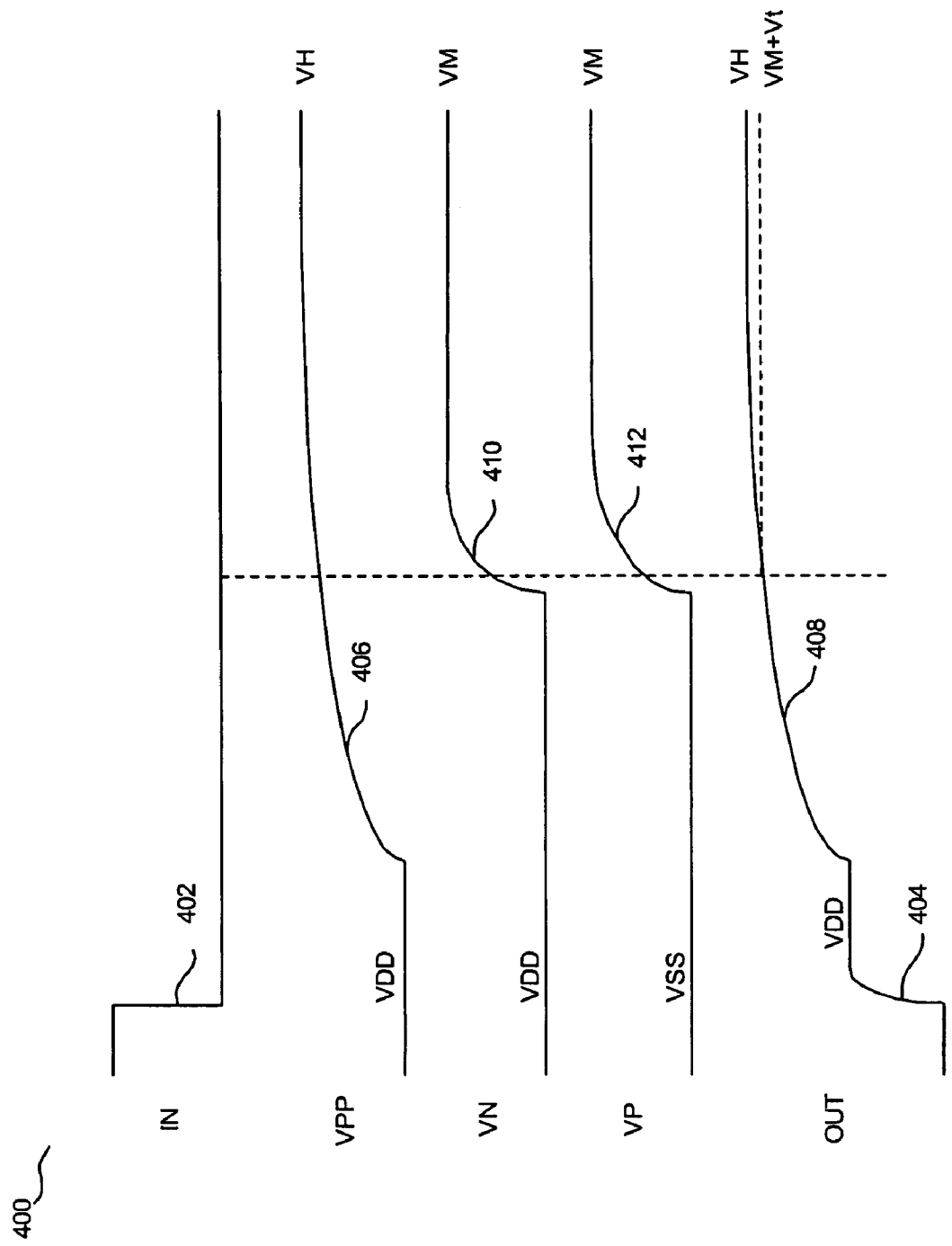
FIG. 4 presents a timing diagram in accordance with the second example of the present disclosure.

FIG. 4 is a timing diagram 400 for the circuit in FIG. 3A. This diagram illustrates the relationship between the input IN, VPP, the nMOS bias voltage VN, the pMOS bias voltage VP, and the output OUT. When the signal IN goes to a low state, as illustrated by the falling edge 402, OUT rises, as illustrated by the rising edge 404, to VPP. In this example, VPP at this point is VDD, or the operating voltage (1.8 volts). When VPP switches from VDD to a high voltage VH, as illustrated by the rising edge 406, OUT rises, as illustrated by the rising edge 408, to VH. As shown, when VN, VP and VPP have risen to a certain level, OUT will rise above VM+Vt. For example, VH may be 13 volts if it is used for programming a memory cell. To ensure that reverse bias is not too high, VN and VP are switched from VDD to VM, as illustrated by the rising edges 410 and 412, respectively. For example, if VH is 13 volts, VM may be 6.5 volts such that the reverse bias at N-well 314 will be roughly 6.5 volts, plus the pMOS threshold voltage. Although the switching time of this HV CMOS switch circuit is slightly delayed from that of the conventional switch circuit, this slight delay is far outweighed by the advantage of the reduced junction voltage stresses.

FIG. 5A presents a table 500 tabulating the theoretical punch through voltage and theoretical gated breakdown voltage for switch circuits 100 and 300. VH is the high voltage, VDD is the operating voltage, Vtn is the nMOS threshold voltage, Vtp is the pMOS threshold voltage, and VM is the bias voltage.

FIG. 5B presents a table 502 tabulating the theoretical values of punch through and gated breakdown voltages for switch circuits 100 and 300. In this example, the following assumptions are used:
VH=13.0 volts
VM=6.5 volts
Vtn=0.5 volts
|Vtp|=0.5 volts
VDD=1.8 volts It is shown that by using two separate N-wells, and by using a bias voltage that is roughly half the value of the actual high voltage, the theoretical maximum reverse bias may be significantly reduced. Specifically, drain-to-source voltage for circuit 300 is approximately half that of circuit 100 (e.g., 7.0 volts vs. 11.7 volts for nMOS transistors, and −7.0 volts vs. −11.7 volts for pMOS transistors). The drain-to-gate voltage for circuit 300 is also approximately half that of circuit 100 (e.g., 6.5 volts vs. 11.2 volts for nMOS transistors, and −6.5 volts vs. −11.2 volts for pMOS transistors).

Figure 6B:
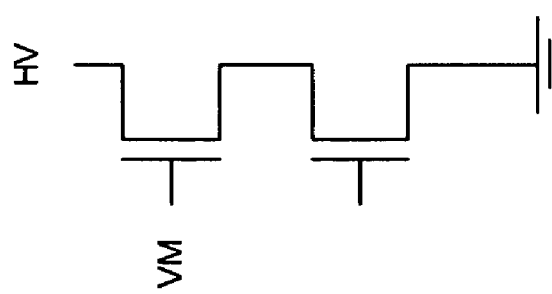
FIGS. 6A and 6B illustrate cascode device structures with P type and N type transistors according to the present disclosure.
Figure 6A:
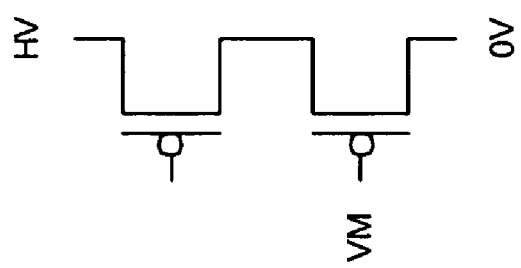

FIGS. 6A and 6B illustrate two simplified cascode structures for pMOS and nMOS high voltage circuits. As illustrated above, when a high voltage is imposed across a regular transistor, in order to reduce the gated stress or drain stress, a cascode structure may be implemented to split the voltage stress imposed there across. For example, FIG. 6A contains a pMOS cascode structure with a voltage drop of HV, which stands for a high voltage much above a regular operating voltage, between the two transistors. When the lower pMOS transistor has a gate voltage raised to about a medium value VM, the gated stress and drain stress for each transistor is potentially reduced. The medium value is determined to have the best result for splitting the high voltage stress, and is preferred to be higher than the regular operating voltage, such as one half of the total voltage across the cascode structure. The transistor having its gate voltage raised to the medium value VM may be referred to as a boosted gate transistor.

FIG. 6B is the cascode structure for NMOS devices and the medium voltage VM is applied to the gate of the transistor directly connected to the high voltage. This boosted gate nMOS transistor also reduces the stress imposed by the high voltage. The cascode structures illustrated by FIGS. 6A and 6B can be implemented in various high voltage circuits as described above with regard to FIG. 2A, 2C, or 3A. Although other components of these circuits may vary, the concept of cascading two or more transistors and raising the gate voltage to medium values should be consistently applied.

By eliminating the need to fabricate high voltage N-wells, extra steps to use high voltage masks to create them may be eliminated, thereby not only simplifying the fabrication process, but also lowering fabrication costs. For example, it is possible to eliminate up to six extra masks in the fabrication of low-cost embedded flash memory, and up to eleven extra masks in the fabrication of a conventional flash memory.

The above disclosure provides many different embodiments, or examples, for implementing different features of the disclosure. Specific examples of components, and processes are described to help clarify the disclosure. These are, of course, merely examples and are not intended to limit the disclosure from that described in the claims. For example, the two boosted gates shown in FIG. 2A, 2C, or 3A have their gate voltages VP and VN generated separately by two generators, but they can be easily generated by one shared voltage generator.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A cascode device structure used for high voltage circuits, the device structure having one or more transistors of a same type connected in a series and being operable with a normal operating voltage and a high operating voltage, the cascode device structure comprising:
   a high operating voltage coupled to a first end of the device structure;
   a low voltage coupled to a second end; and
   one or more control voltages controllably coupled to the gates of the transistors,
   wherein at least one of the control voltages coupled to the gate of at least one transistor is raised to a medium voltage level that is substantially higher than a normal operating voltage and substantially lower than the high operating voltage when operating under the high operating voltage for tolerating stress imposed thereon by the high overating voltage, wherein the control voltages are determined so that the stress imposed by the high voltage is about equally divided by the transistors in the device structure.

2. A high voltage circuit operating with a normal operating voltage and a high operating voltage, the circuit comprising:
   a first cascode device structure having one or more P type transistors connected in series with one end thereof connected to the high operating voltage;
   a second cascode device structure in series with the first cascode device structure at its other end having one or more N type transistors;
   one or more control voltages controllably coupled to the gates of the transistors in the first and second cascode device structure for raising voltages on one or more gates of the transistors to one or more medium values that are above the normal operating voltage for tolerating voltage stress imposed by the high operating voltage; and
   an input module for passing an input signal for turning on a high voltage output; and
   wherein the input module has a third cascode device structure with a gate voltage of at least one transistor raised to a medium value.

3. The circuit of claim 2 wherein the control voltages for the first and second cascode device structures are controlled separately depending on the input signal.

4. The circuit of claim 2 wherein the second cascode device structure is further connected to a grounding voltage.

5. The circuit of claim 2 wherein the transistors in the first cascode device structure have separated N wells.

6. A high voltage circuit operating with a normal operating voltage and a high operating voltage, the circuit comprising:
   a first cascode device structure having one or more P type transistors connected in series with one end thereof connected to the high operating voltage;
   one or more control voltages controllably coupled to the gates of the transistors in the first cascode device structure for raising voltage on one or more gates of the transistors to one or more medium values that are substantially above the normal operating voltage and substantially below the high operating voltage for tolerating voltage stress imposed byte high operating voltage, wherein the P type transistors have separated N wells; and
   an input module for passing an input signal for turning on a high voltage output, wherein the input module has an input cascode device structure with a gate voltage of at least one transistor raised to a predetermined medium value.

* * * * *